(12) United States Patent
Hossain et al.

(10) Patent No.: US 12,166,090 B2
(45) Date of Patent: Dec. 10, 2024

(54) ELECTRONIC DEVICE INCLUDING A TRANSISTOR AND A SHIELD ELECTRODE

(71) Applicant: Semiconductor Components Industries, LLC, Phoenix, AZ (US)

(72) Inventors: Zia Hossain, Tempe, AZ (US); Joseph Andrew Yedinak, Mountain Top, PA (US); Sauvik Chowdhury, San Jose, CA (US); Muh-Ling Ger, Chandler, AZ (US)

(73) Assignee: Semiconductor Components Industries, LLC, Scottsdale, AZ (US)

( * ) Notice: Subject to any disclaimer, the term of this patent is extended or adjusted under 35 U.S.C. 154(b) by 37 days.

(21) Appl. No.: 17/660,691

(22) Filed: Apr. 26, 2022

(65) Prior Publication Data

US 2022/0254889 A1 Aug. 11, 2022

Related U.S. Application Data

(62) Division of application No. 16/847,152, filed on Apr. 13, 2020, now Pat. No. 11,342,424.

(51) Int. Cl.
| | | |
|---|---|---|
| *H01L 29/40* | (2006.01) | |
| *H01L 29/06* | (2006.01) | |
| *H01L 29/36* | (2006.01) | |
| *H01L 29/423* | (2006.01) | |
| *H01L 29/66* | (2006.01) | |
| *H01L 29/78* | (2006.01) | |

(52) U.S. Cl.
CPC ........ *H01L 29/407* (2013.01); *H01L 29/0657* (2013.01); *H01L 29/36* (2013.01); *H01L 29/4236* (2013.01); *H01L 29/66734* (2013.01); *H01L 29/7813* (2013.01)

(58) Field of Classification Search
CPC ... H01L 29/407; H01L 29/0657; H01L 29/36; H01L 29/4236; H01L 29/66734; H01L 29/7813
USPC ......................................................... 257/231
See application file for complete search history.

(56) References Cited

U.S. PATENT DOCUMENTS

| | | |
|---|---|---|
| 10,164,091 B1 | 12/2018 | Loechelt |
| 10,236,342 B2 | 3/2019 | Loechelt |
| (Continued) | | |

OTHER PUBLICATIONS

Fairchild Semiconductor AN-6099 Brochere; Fairchild Semiconductor Corporation; pp. 1-11 (2013).

(Continued)

*Primary Examiner* — Dzung Tran
(74) *Attorney, Agent, or Firm* — Abel Schillinger, LLP

(57) ABSTRACT

An electronic device can include a substrate, an active region of a transistor, and a shield electrode. The substrate can define a trench and include a mesa adjacent to the trench, and the shield electrode can be within the trench. In an embodiment, the electronic device can further include an active region of a transistor within the mesa and an insulating layer including a thicker section and a thinner section closer to a bottom of the trench. In another embodiment, the electronic device can include a body region and a doped region within the mesa and spaced apart from the body region by a semiconductor region. The doped region can have a dopant concentration that is higher than a dopant concentration of the semiconductor region and a portion of the substrate underlying the doped region.

20 Claims, 7 Drawing Sheets

(56) References Cited

U.S. PATENT DOCUMENTS

| | | |
|---|---|---|
| 2006/0289929 A1 | 12/2006 | Andrews |
| 2010/0187602 A1 | 7/2010 | Woolsey et al. |
| 2011/0031551 A1* | 2/2011 | Andrews ........... H01L 29/66734 |
| | | 257/330 |
| 2011/0136310 A1 | 6/2011 | Grivna |
| 2011/0233659 A1 | 9/2011 | Tai |
| 2011/0244641 A1 | 10/2011 | Pan et al. |
| 2012/0326227 A1 | 12/2012 | Burke et al. |
| 2014/0015039 A1 | 1/2014 | Hossain |
| 2014/0054682 A1* | 2/2014 | Padmanabhan ....... H01L 29/407 |
| | | 438/270 |
| 2014/0054691 A1 | 2/2014 | Yilmaz et al. |
| 2017/0012118 A1 | 1/2017 | Park et al. |

OTHER PUBLICATIONS

Sze, S.M., editor; "FIG. 22 Conversion between resistivity and dopant density in silicon"; VLSI Technology; McGraw-Hill Book Company; p. 33 (1983).

\* cited by examiner

ELECTRONIC DEVICE INCLUDING A TRANSISTOR AND A SHIELD ELECTRODE

CROSS REFERENCE TO RELATED APPLICATION

This application is a divisional of and claims priority under 35 U.S.C. § 120 to U.S. patent application Ser. No. 16/847,152 entitled "Electronic Device Including a Transistor and a Shield Electrode" by Hossain et al., filed Apr. 13, 2020, which is assigned to the current assignee hereof and incorporated herein by reference in its entirety.

FIELD OF THE DISCLOSURE

The present disclosure relates to electronic devices, and more particularly to, electronic devices that include transistors and shield electrodes.

RELATED ART

A power metal-oxide-semiconductor field-effect transistor (MOSFET) may experience an unacceptably high voltage overshoot during switching operations. A shield electrode within a trench may be used to help increase output capacitance. An insulating layer can lie between the shield electrode and a mesa that includes an active region of the power MOSFET. The insulating layer has a thickness that increases with trench depth, such that the insulating layer is thicker near the bottom of the trench and thinner at an elevation at the top of the shield electrode. Such a power MOSFET may still have too much voltage overshoot. Output capacitance can be increased by increasing the depth of the trench; however, the trench is already deep and a further increase of the depth of the trench may lead to process complexity (e.g., photolithography operations may become significantly more difficult, filling very deep trenches can use an excessive amount of material and may require longer removal operations to remove the material outside the trench, etc.), a greater likelihood of wafer bowing, or other complications. Further improvement in reducing voltage overshoot during switching operations is desired.

BRIEF DESCRIPTION OF THE DRAWINGS

Embodiments are illustrated by way of example and are not limited in the accompanying figures.

Figure 1:
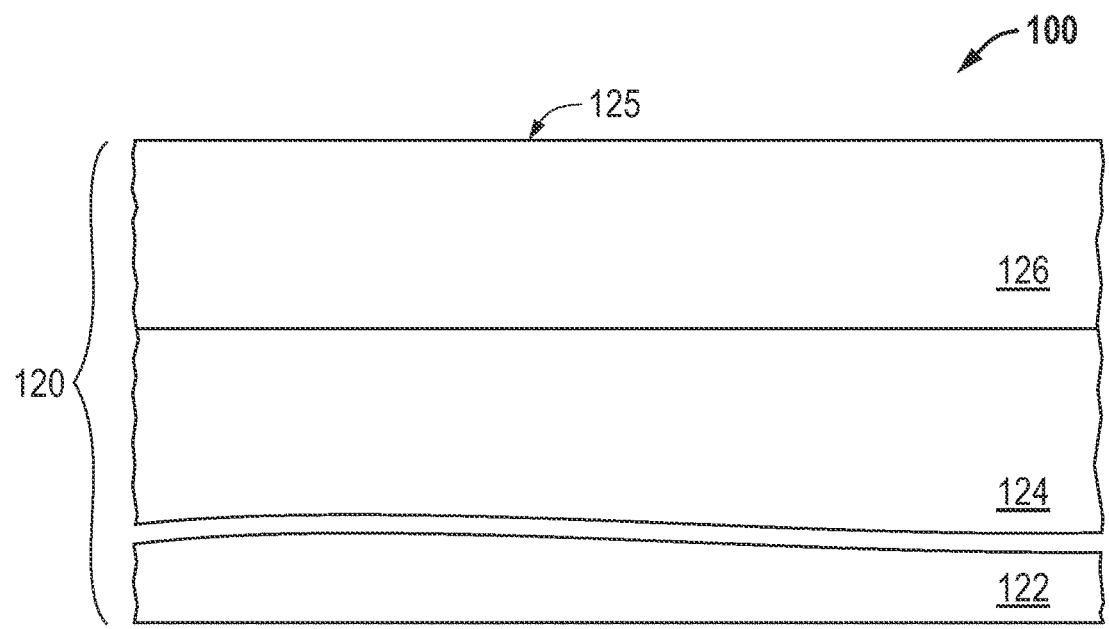
FIG. 1 includes an illustration of a cross-sectional view of a portion of a workpiece that includes a substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

Group numbers correspond to columns within the Periodic Table of Elements based on the IUPAC Periodic Table of Elements, version dated Nov. 28, 2016.

The terms "depth" and "height" are measured in a direction perpendicular to a primary surface of a substrate or semiconductor layer.

The terms "horizontal," "lateral," and their variants are in a direction parallel to a primary surface of a substrate or semiconductor layer, and the terms "vertical" and its variants are in a directions perpendicular to a primary surface of a substrate or a semiconductor layer.

A border between a more heavily doped region and an immediately adjacent and more lightly doped region or layer of the same conductivity type is where the dopant concentration of the more lightly doped region is 10% higher than the difference between the peak dopant concentration of the more heavily doped region and the average dopant concentration of such more lightly doped region or layer.

The term "midpoint elevation," with respect to a section, portion, or other feature, is intended to mean the average elevation of a lowest elevation and a highest elevation of such section, portion, or other feature.

Heights and elevations of shield electrodes are for portions of the shield electrodes that underlie gate electrodes and not for portions of the shield electrodes where electrical contacts to interconnects are made to the shield electrodes.

The term "voltage rating," with reference to an electronic device, means a nominal voltage that the electronic device is designed to withstand. For example, a transistor with a voltage rating of 50 V is designed for a 50 V difference between drain and source regions or electrodes or collector and emitter regions or electrodes when the transistor in an off-state. The transistor may be able to withstand a higher voltage, such as 60 V or 70 V, for a limited duration, such as during and shortly after a switching operation, without significantly permanently damaging the transistor.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described. When values of a parameter are significantly different, such values are more than 10% different (and more than 20% different for semiconductor doping concentrations).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a substrate defining trenches, an active region within a mesa between trenches, and a shield electrode adjacent to the mesa. The electronic device may have an insulating layer with a relatively thinner section between the shield electrode and mesa, a relatively heavier doped region within the mesa and adjacent to the shield electrode, or both the relatively thinner section and the relatively heavier doped region. The thinner section, the relatively heavier doped region, or both can help to increase output capacitance ($C_{OSS}$) to an acceptable value and still maintain a sufficiently high drain-to-source breakdown voltage ($BV_{DS}$).

In an aspect, an electronic device can include a substrate, an active region, a shield electrode, and an insulating layer. The substrate can define a trench extending from a primary surface of the substrate, wherein the substrate includes a mesa adjacent to the trench, and the trench has a lowermost point along a bottom of the trench. The active region of a transistor can be within the mesa. The shield electrode can be within the trench, wherein the shield electrode has an uppermost point closer to the primary surface of the substrate than to the lowermost point along the bottom of the trench. The insulating layer can include a thinner section and a thicker section, wherein each of the thinner section and the thicker section is disposed between the shield electrode and the mesa. The bottom of the trench is closer to the thinner section than to the thicker section.

In another aspect, an electronic device can include a substrate, a shield electrode, a body region, and a doped region. The substrate can define a trench extending from a primary surface of the substrate, wherein the substrate includes a mesa adjacent to the trench. The shield electrode can be within the trench. The body region can be within the mesa, and the doped region can be within the mesa, spaced apart from the body region by a semiconductor region, and adjacent to the shield electrode. The body region and the doped region can be parts of an active region of a transistor, and the doped region can have a dopant concentration that is higher than a dopant concentration of each of the semiconductor region and a portion of the substrate underlying the doped region.

In a further aspect, an electronic device can include a substrate, a shield electrode, a body region, a first doped region, and a second doped region. The substrate can define a trench extending from a primary surface of the substrate, wherein the substrate includes a mesa adjacent to the trench. The shield electrode, the first doped region, and the second region can be within the mesa. The first doped region can be spaced apart from the body region and adjacent to the shield electrode. The second doped region can be disposed between and spaced apart from each of the body region and the first doped region, and adjacent to the shield electrode. Each of the first doped region and the second doped region can have a dopant concentration that is greater than dopant concentrations of portions of the mesa between (1) the body region and the second doped region and (2) the first doped region and the second doped region.

FIG. 1 includes a cross-sectional view of a portion of a workpiece 100 that includes a substrate 120 having a primary surface 125. The substrate 120 can include a semiconductor base material 122, a lower semiconductor layer 124, and an upper semiconductor layer 126. Each of the semiconductor base material 122, the lower semiconductor layer 124, and the upper semiconductor layer 126 can be monocrystalline and include a semiconductor base material that includes at least one Group 14 element and can include Si, Ge, SiC, SiGe, or the like. In an embodiment, the semiconductor base material 122 can be in the form of a semiconductor wafer. The lower semiconductor layer 124 can be epitaxially grown from the semiconductor base material 122, and the upper semiconductor layer 126 can be epitaxially grown from the lower semiconductor layer 124.

The semiconductor base material 122 can be n-type doped or p-type doped and have a dopant concentration of at least $1 \times 10^{18}$ atoms/cm$^3$. The lower semiconductor layer 124 can have the same conductivity type as the semiconductor base material 122 and a dopant concentration lower than the semiconductor base material 122. In an embodiment, the lower semiconductor layer 124 can have a dopant concentration of at most $1 \times 10^{17}$ atoms/cm$^3$, and in a particular embodiment, is at most $5 \times 10^{16}$ atoms/cm$^3$. The lower semiconductor layer 124 can have a dopant concentration greater than $1 \times 10^{15}$ atoms/cm$^3$. As originally formed, the upper semiconductor layer 126 can be more lightly doped as compared to the lower semiconductor layer 124. In an embodiment, the originally-formed upper semiconductor layer 126 can have a dopant concentration of at most $1 \times 10^{15}$ atoms/cm$^3$ or can be undoped. During subsequent processing, dopant from the lower semiconductor layer 124 can diffuse into the upper semiconductor layer 126. In a finished device, the portion of the upper semiconductor layer 126 below a subsequently-formed body region has the same conductivity type as the lower semiconductor layer 124.

The thicknesses of the lower semiconductor layer 124 and the upper semiconductor layer 126 can depend on the voltage rating of the transistor and on the dopant concentrations of the lower semiconductor layer 124 and the portion of the upper semiconductor layer 126 between the lower semiconductor layer 124 and the subsequently-formed body region in a finished device. A drift region for the transistor being formed can include a combination of the portion of the upper semiconductor layer 126 and the lower semiconductor layer 124. In an embodiment, the thickness of the lower semiconductor layer 124 can be in a range of 2 microns to 30 microns. In another embodiment, the thickness of the upper semiconductor layer 126 can be in a range from 0.3 micron to 5 microns. The thicknesses of the layers 124 and 126 may be outside the described ranges if needed or desired for a particular application.

Although not illustrated in FIG. 1, optional pad and oxidation-resistant layers may be used and removed after forming some or all features within subsequently defined trenches. The optional pad and oxidation-resistant layer may be removed before completing formation of the device. More details regarding the optional pad and oxidation-resistance layers are described later in this specification with respect to an alternative embodiment.

Figure 2:
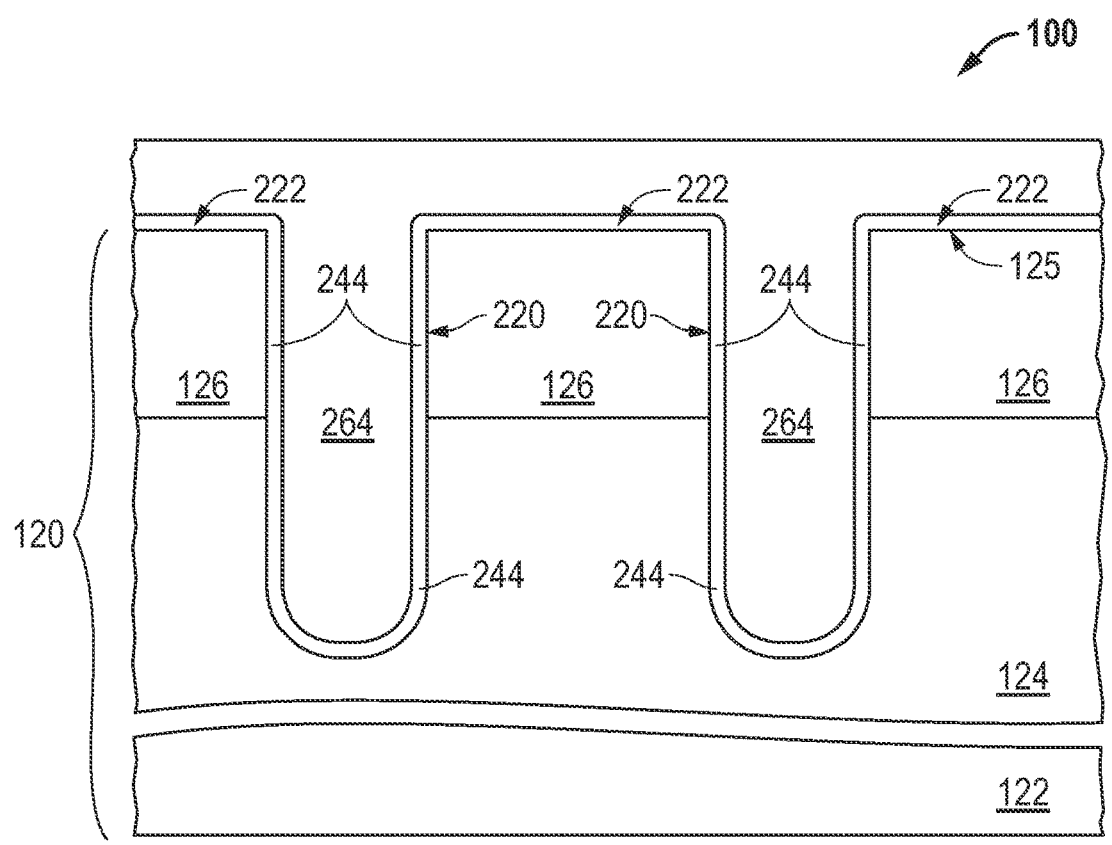
FIG. 2 includes an illustration of a cross-sectional view of the workpiece of FIG. 1 after defining trenches, forming an insulating layer, and forming a conductive layer.

FIG. 2 includes the workpiece 100 after a portion of the substrate 120 has been removed to define trenches 220 and after forming an insulating layer 244 and a conductive layer 264 within the trenches 220 and over the primary surface 125 of the substrate 120. Portions of the substrate 120 between the trenches 220 are mesas 222. The trenches 220 extend through the upper semiconductor layer 126 and into the lower semiconductor layer 124. The trenches 220 can be spaced apart from the semiconductor base material 122. The depths of the trenches 220 can be measured as elevation differences between the primary surface 125 and a lowermost point along a bottom of each of the trenches 220. The depths may be selected based on the voltage rating of the transistor being formed. The embodiments as described herein are well suited for voltage ratings from 20 V to 300 V, although the concepts described herein can be extended to transistors having voltage ratings outside such range. The depths of the trenches 220 can be in a range from 1.1 microns to 20 microns. The depths of the trenches 220 may be outside the range if needed or desired for a particular application.

The trenches 220 can have vertical or nearly vertical sidewalls. Thus, the sidewalls of the trenches 220 can be perpendicular to the primary surface 125 or up to 5° from perpendicular to the primary surface 125.

To allow for a reasonably small area occupied by the transistor, widths of the trenches 220 and mesas 222 can be relatively small as compared to the depths of the trenches 220. The widths of the trenches 220 and mesas 222 can be measured along a plane defined by the primary surface 125. The widths of the trenches 220 may depend on the depths of the trenches 220. The mesas 222 may depend on geometries for subsequently-formed source regions, body contact regions, and interconnects that contact the source and body contact regions. Furthermore, the widths of the trenches 220 and mesas 222 may change during trench processing when insulating layers are grown. In an embodiment, a finished device can include the trenches 220 that have widths in a range of 0.15 micron to 3.0 microns. In another embodiment, the finished device can include the mesas 222 that have widths in a range of 0.2 micron to 5.0 microns. The widths of the trenches 220 and the mesas 222 may be outside the ranges if needed or desired for a particular application.

The insulating layer 244 fills part and not all of the trenches 220. The insulating layer 244 can include an oxide, a nitride, or an oxynitride. The thickness of the insulating layer 244 can be selected to provide a desired capacitance between a lower portion of the shield electrode (which will include a portion of the conductive layer 264) and the adjacent mesas 222. Such capacitance affects $C_{OSS}$ of the device. In an embodiment, the insulating layer 244 can have a thickness of at least 50 nm, at least 150 nm, or at least 300 nm, and in another embodiment, the insulating layer 244 can have a thickness of at most 1800 nm, at most 1600 nm, or at most 1400 nm. The insulating layer 244 can be deposited or thermally grown. When the insulating layer 244 is thermally grown, dopant from the lower semiconductor layer 124 can diffuse into the upper semiconductor layer 126 to make a smoother dopant concentration gradient within the mesas 222.

The conductive layer 264 can be deposited to fill remaining portions of the trenches 220. Some of the conductive layer 264 is also deposited over the mesas 222. The conductive layer 264 can include a single film or a plurality of films. The composition of the conductive layer 264 may depend on subsequent thermal cycles to which the conductive layer 264 will be exposed. Doped semiconductor and conductive refractory materials can be used when the conductive layer 264 is subsequently exposed to temperatures of at least 700° C. Al and other materials with lower melting points may be used if the workpiece 100 will not be exposed to such high temperatures. In an embodiment, the conductive layer can include an adhesion film and a barrier film. In an embodiment, the conductive layer 264 can include a doped semiconductor material, a refractory metal, a refractory silicide, or refractory nitride. Such conductive materials may include doped Si, doped SiC, Ta, TaSi, Ti, TiW, TiSi, TiN, W, or the like. In a particular embodiment, the conductive layer 264 includes a base material that is the same as the base material within the mesas 222 to reduce stress within the workpiece 100 due to subsequent thermal cycles. For example, the conductive layer 264 can include heavily doped Si (e.g., dopant concentration of at least $1\times10^{19}$ atoms/cm$^3$) when the mesas 222 include monocrystalline Si. After reading this specification, skilled artisans will be able to determine the number of films and materials for the conductive layer 264 to meet the needs or desires for a particular application.

Figure 3:
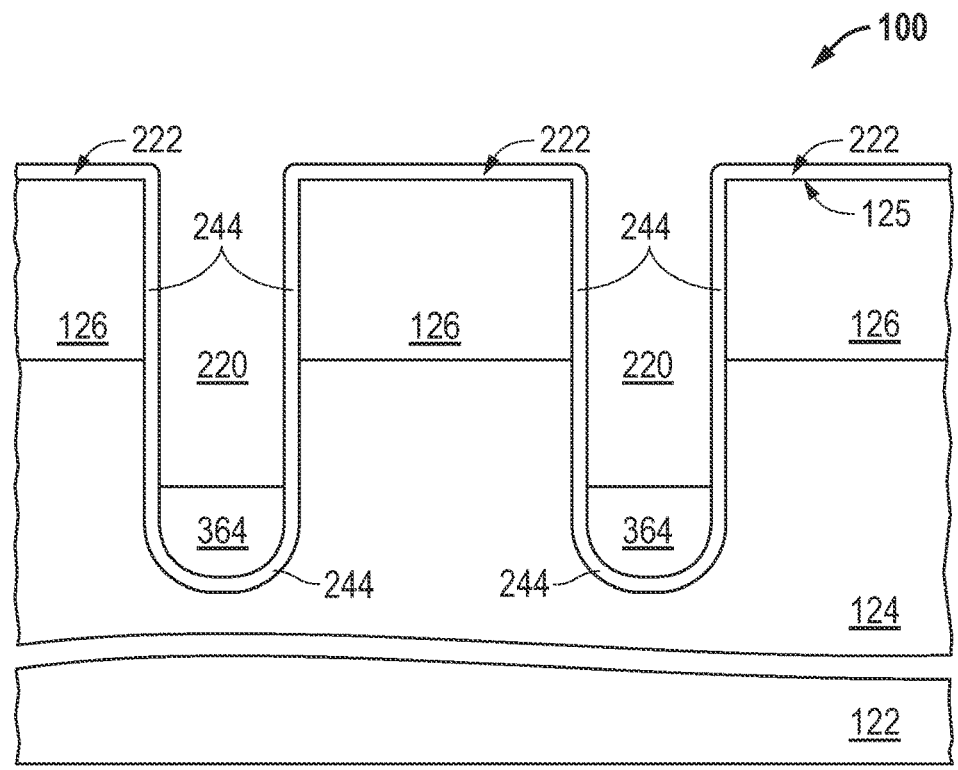
FIG. 3 includes an illustration of a cross-sectional view of the workpiece of FIG. 2 after removing portions of the conductive layer to form lower portions of a shield electrode.

FIG. 3 illustrates the workpiece 100 after the conductive layer 264 is etched and recessed within the trenches 220 to form the lower portions 364 of the shield electrodes. The heights of the lower portions 364 are described after formation of the shield electrode is completed.

Figure 4:
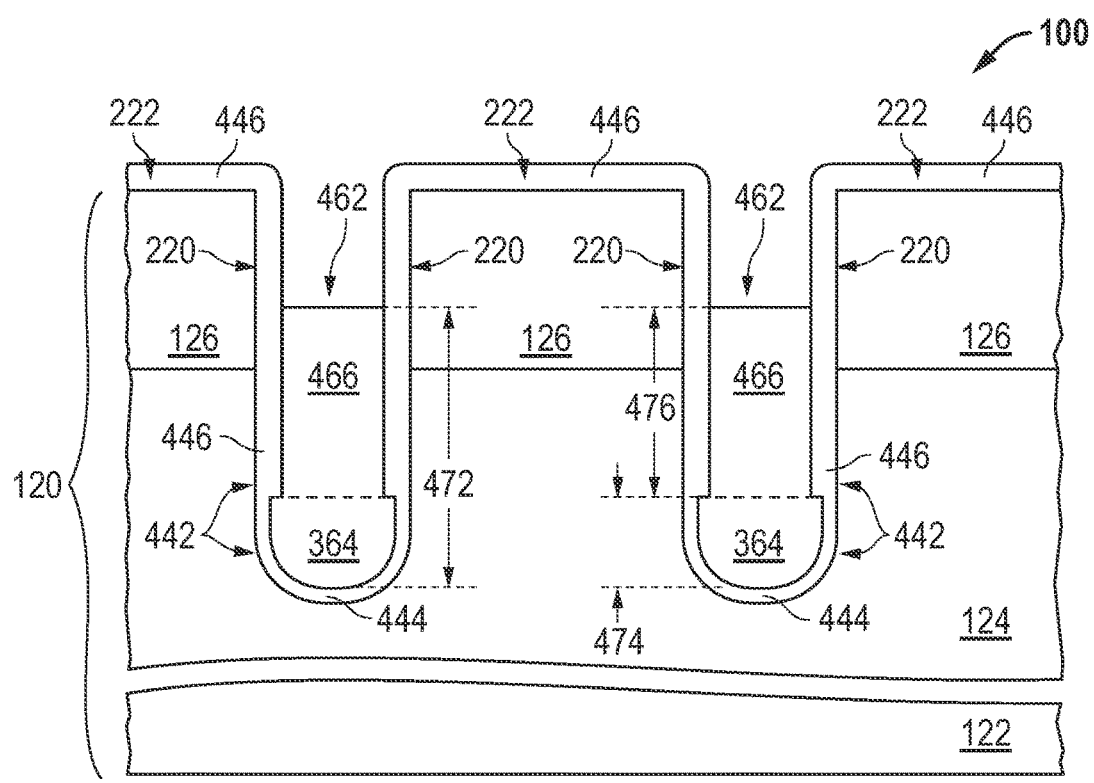
FIG. 4 includes an illustration of a cross-sectional view of the workpiece of FIG. 3 after forming a thicker section of an insulating layer and forming upper portions of the shield electrode.

FIG. 4 illustrates the workpiece 100 after completing formation of the insulating layer 442 and forming a remaining portion 466 of the shield electrode 462. The insulating layer 244 becomes the lower sections 444 of the insulating layer 442. Upper sections 446 of the insulating layer 442 can be achieved by depositing an insulating layer or by thermally growing more of the insulating layer from the sidewalls of the adjacent mesas 222. In an embodiment, the upper sections 446 of the insulating layer 442 can be at least 5 nm, at least 11 nm, or at least 20 nm thicker than the lower sections 444, and in another embodiment, the increase can be at most 200 nm, at most 150 nm, or at most 90 nm thicker than the lower sections 444. In a finished device, the lower sections 444 are between the lower portions 364 of the shield electrode 462 and the substrate 120, and the upper sections 446 are between the upper portion 466 of the shield electrode 462 and its adjacent mesa 222. In an embodiment, the thickness of lower sections 444 can be at most 0.995, at most 0.98, or at most 0.095 times the thickness of the upper sections 446, and in another embodiment, the thickness of lower sections 444 can be at least 0.50, at least 0.70, or at least 0.80 times the thickness of the upper sections 446.

A conductive layer can be deposited to fill a remaining portion of the trenches 220. The conductive layer can use any of the materials as previously described with respect to the conductive layer 264. The conductive layer at this point in the process can be the same composition or have a different composition as compared to the conductive layer 264. The conductive layer is etched and recessed within the trenches 220 to form the upper portions 466 of the shield electrodes 462.

The heights 474 of the lower portions 364 can vary with the depths of the trenches 220. Thus, the heights 474 of the lower portions 364 are described as a percentage of the total height 472 of corresponding shield electrode 462 within the same trenches 220. In an embodiment, the heights 474 of the lower portions 364 are at least 2%, at least 5%, or at least 11% of the heights 472 of their corresponding shield electrodes 462, and in another embodiment, the heights 474 of the lower portions 364 are at most 90%, at most 70%, or at most 50% of the heights 472 of their corresponding shield electrodes 462. In a particular embodiment, the heights 474 of the lower portions 364 are in a range from 15% to 30% of the heights 472 of their corresponding shield electrodes 462. The heights 476 of the upper portions 466 make up the balance of the heights 472 of the shield electrodes 462 in the embodiment as illustrated in FIG. 4. The heights of the lower sections 444 of the insulating layer 442 can be the sum of the heights of the lower portions 364 of the shield electrodes 462 and the thickness of the lower sections 444 of the insulating layer 442.

Figure 5:
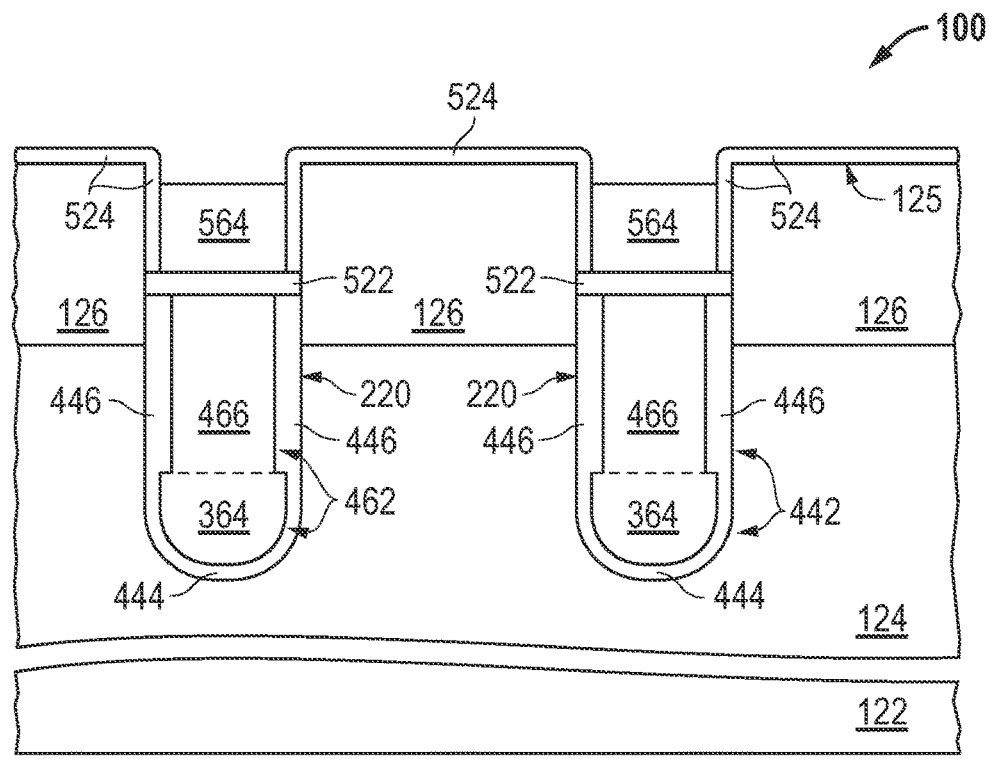
FIG. 5 includes an illustration of a cross-sectional view of the workpiece of FIG. 4 after removing portions of the insulating layer and forming another insulating layer, a gate dielectric layer, and gate electrodes.

FIG. 5 illustrates the workpiece 100 after an insulating layer 522, a gate dielectric layer 524, and gate electrodes 564 are formed. The insulating layer 522 includes an oxide, a nitride, or an oxynitride and has a thickness to keep the gate-to-source capacitance sufficiently low. In an embodiment, the insulating layer 522 may be deposited in a technique that results in a nonconformal deposition that favors deposition along horizontal surfaces as opposed to vertical surfaces. In another embodiment, a conformal technique may be used. The insulating layer 522 has a thickness in a range of 20 nm to 300 nm. Portions of the insulating layer 522 that are originally formed along the upper parts of the trenches 220 can be removed to allow the gate dielectric layer 524 to be formed along such portions. If the pad and oxidation-resistant layers were used, they can be removed from over the mesas 222. The gate dielectric layer 524 can include an oxide, a nitride, or an oxynitride and may be deposited or thermally grown. The gate dielectric layer 524 can have a thickness in a range from 11 nm to 150 nm.

A conductive layer for the gate electrodes 564 can be deposited to fill remaining portions of the trenches 220. The conductive layer can use any of the materials as previously described with respect to the conductive layer 264. The conductive layer at this point in the process can have the same composition or a different composition as compared to the conductive layer 264. The material of the conductive layer for the gate electrodes 564 may be selected to achieve a desired work function that affects the threshold voltage of the transistor being formed. For an n-channel transistor, the conductive layer for the gate electrode 564 can include heavily doped n-type polycrystalline Si, and for a p-channel transistor, the conductive layer for the gate electrodes 564 can include heavily doped p-type polycrystalline Si. The conductive layer is etched and recessed within the trenches 220 to form the gate electrodes 564. The amount of recession of the gate electrodes 564 can depend on the depth of the subsequently-formed source regions. The uppermost part of the gate electrodes 564 can be at an elevation that is higher than the lowermost part of its adjacent source regions. The overlap in elevations should be kept relatively small to keep gate-to-source capacitance acceptably low. In an embodiment, the recession can be in a range of 0.11 micron to 0.9 micron below the primary surface 125.

Figure 6:
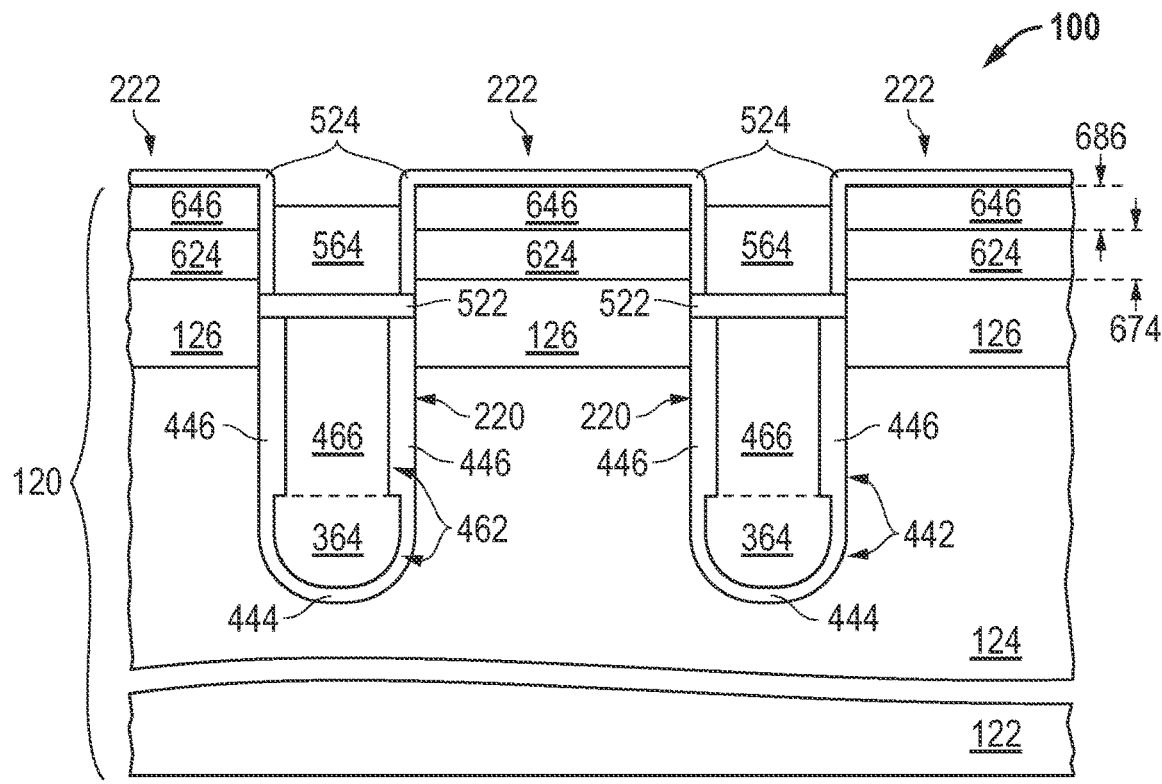
FIG. 6 includes an illustration of a cross-sectional view of the workpiece of FIG. 5 after forming body regions and source regions.

FIG. 6 illustrates the workpiece 100 after forming body regions 624 and source regions 646. The body regions 624 and source regions 646 can be formed by ion implantation using appropriate doping species. In an embodiment, the body regions 624 are formed before the source regions 646; however, in another embodiment, the order may be reversed.

The body regions 624 include the channel regions for the transistor structures. The body regions 624 have a conductivity type opposite of the conductivity type of the lower semiconductor layer 124. The dopant concentration of the body regions 624 affect the threshold voltage of the transistor. The dopant concentration of the body regions 624 is higher than portions of the mesas 222 immediately below the body regions 624. In an embodiment, the body regions 624 have a dopant concentration in a range of $1\times10^{15}$ atoms/cm$^3$ to $1\times10^{17}$ atoms/cm$^3$. In the embodiment as illustrated in FIG. 6, the lowermost elevations of the body regions 624 are at a higher elevation than the lowermost elevations of their adjacent gate electrodes 564. In another embodiment (not illustrated), the lowermost elevations of the body regions 624 are at a lower elevation than the lowermost elevations of their adjacent gate electrodes 564. In an embodiment, the heights 674 of the body regions 624 (between their corresponding source regions 646 and upper semiconductor layer 126) is in a range of 110 nm to 950 nm.

The source regions 646 have a conductivity type opposite the conductivity type of the body regions 624. The source regions 646 are heavily doped to allow ohmic contacts to be made to a subsequently-formed interconnect. The source regions 646 have a dopant concentration of at least $1 \times 10^{19}$ atoms/cm$^3$. In an embodiment, the depths 686 of the source regions 646 are in a range of 5 nm to 30 nm.

Figure 7:
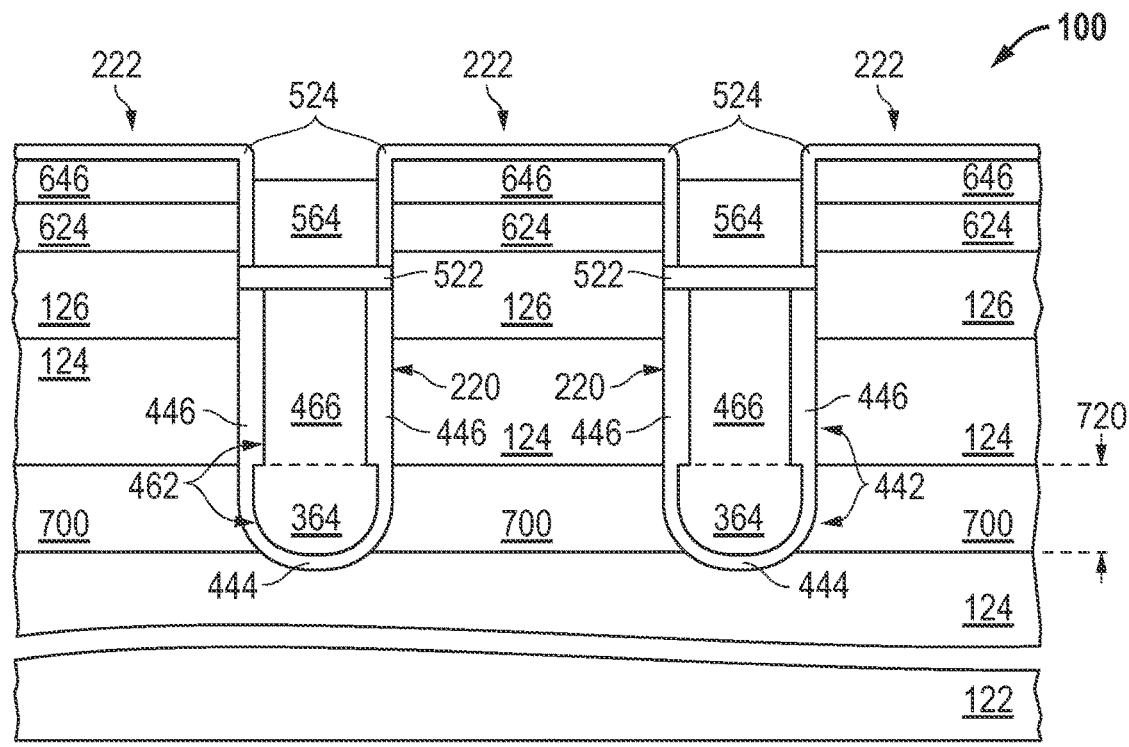
FIG. 7 includes an illustration of a cross-sectional view of the workpiece of FIG. 6 after forming doped regions adjacent to the lower portions of the shield electrodes.

FIG. 7 illustrates the workpiece 100 after forming doped regions 700. The doped regions 700 affect $C_{OSS}$ of the device. Increasing the dopant concentration of the doped regions 700, increasing the heights of the doped regions 700, or both of the doped regions 700 increases $C_{OSS}$. However, if the dopant concentration of the doped regions 700, the heights of the doped regions 700, or both are increased too much, the drain-to-source breakdown voltage ($BV_{DS}$) may become unacceptably low. The lower sections 444 of the insulating layer 442 adjacent to the doped regions 700 can allow a relatively heavier dopant concentration to be used for the doped regions 700 before $BV_{DS}$ is significantly affected. For example, briefly referring to FIG. 13, as compared to a uniform thickness for an insulating layer within the trenches 220, the lower sections 444 of the insulating layer 442 allow the dopant concentration of the doped regions 700 to be approximately 3.5 times higher and still have a higher $BV_{DS}$ as compared to a transistor structure having the uniform thickness for the insulating layer. The thinner portions of the insulating layer 442 are not required in all embodiments, as $C_{OSS}$ can still be increased even when the dopant concentrations of the doped regions 700 are present.

The doped regions 700 have the same conductivity type as the lower semiconductor layer 124. The dopant concentration of the doped regions 700 can be higher than portions of the lower semiconductor layer 124 and the upper semiconductor layer 126 that lie between the doped regions 700 and body regions 624. Any increase in dopant concentration over the lower semiconductor layer 124 at the same elevation improves $C_{OSS}$, and thus, a dopant concentration even 1.01 times the dopant concentration of the lower semiconductor layer 124 immediately above the doped regions 700 can be used. Accordingly, in an embodiment, a dopant concentration of the doped regions 700 can be at least 1.01 times the dopant concentration over the lower semiconductor layer 124 immediately above the doped regions 700. In an embodiment, the dopant concentration of the doped regions 700 can be at 1.1 times, at least or at least 2 times an average dopant concentration of the corresponding portions of the lower semiconductor layer 124 and the upper semiconductor layer 126 within the same mesa 222. In another embodiment, the dopant concentration of the doped regions 700 can be at most 50 times, at most 35 times, or at most 20 times an average dopant concentration of the corresponding portions of the lower semiconductor layer 124 and the upper semiconductor layer 126 within the same mesa 222. In an embodiment, the dopant concentration of the doped regions 700 can be at most $1 \times 10^{18}$ atoms/cm$^3$, $5 \times 10^{17}$ atoms/cm$^3$, or $1 \times 10^{17}$ atoms/cm$^3$.

The heights of the lower sections 444 of the insulating layer 442 and the heights of the doped regions 700 may depend on the voltage rating of the transistor being formed. In general, the uppermost elevations of doped regions 700 may be at substantially the same elevation or lower than elevations of the uppermost elevations of the lower sections 444 of the insulating layer 442. If the lower sections 444 of the insulating layer 442 extend to the bottoms of the trenches 220, the doped regions 700 may extend to elevations that are the same or lower than the bottoms of the trenches 220. If the lower sections 444 of the insulating layer 442 are spaced apart from the bottom of the trenches 220, the doped regions 700 may extend to elevations that are the same or higher than the bottoms of the trenches 220. In another embodiment, the uppermost elevations of the doped regions 700 may extend into an elevation of a thicker section 446 of the insulating layer 442; however, such extension to the thicker section 446 of the insulating layer 442 should be insignificant, such as no more than 10% of the height of the thicker section 446 of the insulating layer 442. Thus, the heights of the lower sections 444 of the insulating layer 442 and heights of the doped regions 700 can be interrelated to each other.

The heights of the lower sections 444 of the insulating layer 442, the heights 720 of the doped regions 700, or both may vary with the depths of the trenches 220 and voltage rating of the transistor. Thus, the lower sections 444, the doped regions 700, or both the lower sections 444 and doped regions 700 may be described as a percentage of the depths of their corresponding trenches 220. In an embodiment, heights of the lower sections 444 and doped regions 700 are at least 2%, at least 5%, or at least 11% of the depths of their corresponding trenches 220, and in another embodiment, the lower sections 444, the doped regions 700, or both the lower sections 444 and doped regions 700 are at most 90%, at most 70%, or at most 50% of the depths of their corresponding trenches 220. In a particular embodiment, the lower sections 444, the doped regions 700, or both the lower sections 444 and doped regions 700 are in a range from 11% to 40% of the depths of their corresponding trenches 220.

In the embodiment as illustrated in FIG. 7, the doped regions 700 can be formed by ion implantation. The energy for the implant can be selected so that the projected range ($R_P$) corresponds to the desired depth of the centers of the doped regions 700. $R_P$ can depend on the voltage rating of the transistor. For a voltage rating in a range from 20 V to 300 V and when the doped regions 700 are adjacent to the lower portions 364 of the shield electrodes 462, the energy may be in a range of 0.5 MeV to 10 MeV. The dose for the implant can be selected to increase $C_{OSS}$ without lowering $BV_{DS}$ below an acceptable level. A higher dose for a relatively higher voltage rating may be used to account for a higher amount of implant straggle ($\Delta R_P$) that occurs with higher implant energies. The dose may be at most $5 \times 10^{13}$ ions/cm$^2$, at most $1 \times 10^{13}$ ions/cm$^2$, or at most $1 \times 10^{12}$ ions/cm$^2$.

The formation of the doped regions 700 may occur using other techniques or at different points in the process flow. Alternative embodiments for forming the doped regions 700 are described later in this specification.

Figure 8:
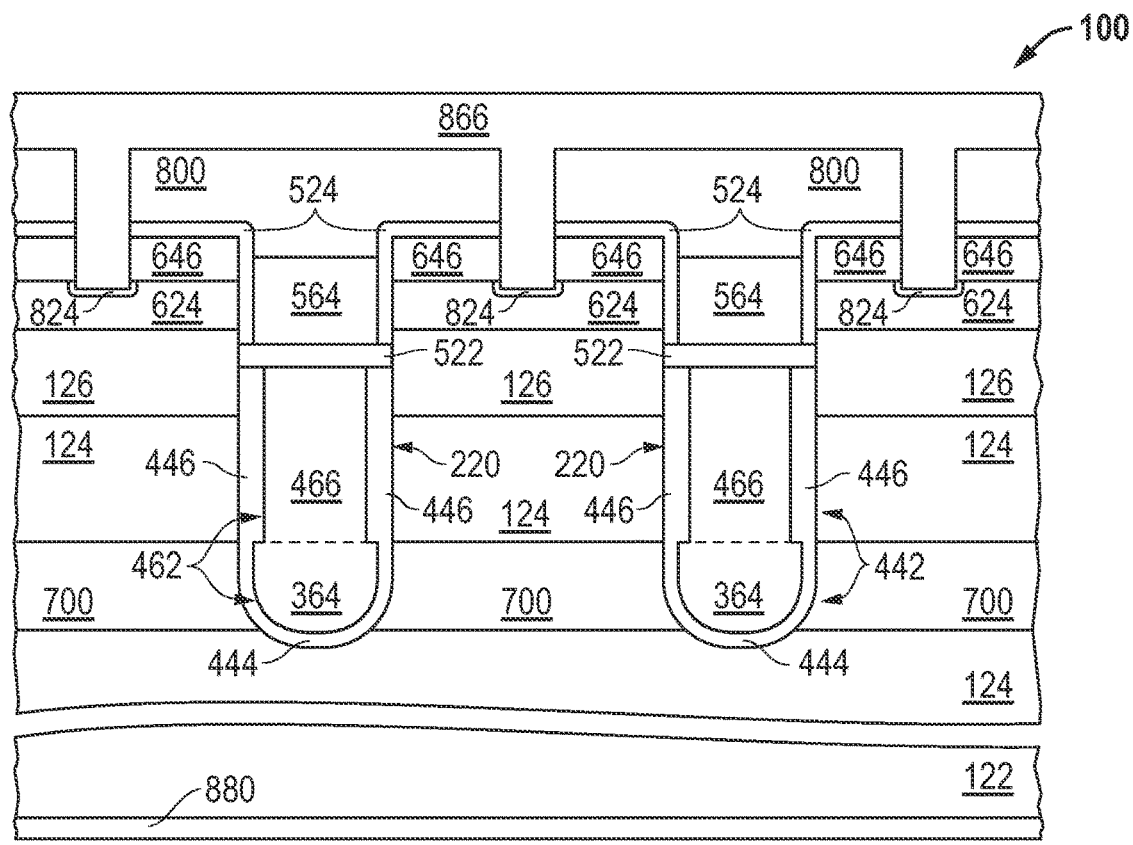
FIG. 8 includes an illustration of a cross-sectional view of the workpiece of FIG. 7 after forming a substantially completed electronic device.

FIG. 8 includes an illustration after forming a substantially completed electronic device. An interlevel dielectric (ILD) layer 800 can be formed over the exposed surface of the workpiece 100. The ILD layer 800 can include a single film or a plurality of films. The single film or each of the films can include an oxide, a nitride, or an oxynitride. In an embodiment, the ILD layer 800 can have a thickness in a range from 20 nm to 2000 nm. The ILD layer 800 can be patterned to define contact openings that extend through the source regions 646 to the body regions 624. Dopant can be introduced to form body contact regions 824 that have a dopant concentration of at least $1 \times 10^{19}$ atoms/cm$^3$. An anneal may be performed at this point in the process to activate the dopants introduced into the mesas after the gate electrodes 564 are formed. At other locations not illustrated in FIG. 8, the ILD layer 800 can also be patterned to define contact openings that extend through the ILD layer 800 to the gate electrodes 564 and the shield electrodes 462.

A conductive layer is formed over the ILD layer 800 and within the contact openings. The conductive layer can include a single film or a plurality of films. In an embodiment, the conductive layer can include an adhesion film and a barrier film. Such films may include Ta, TaSi, Ti, TiW, TiSi, TiN, W, or the like. The conductive layer can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the conductive layer. In an embodiment, the bulk film has a thickness in a range from 20 nm to 6000 nm and, in a more particular embodiment, in a range from 50 nm to 4000 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices. The conductive layer is patterned to complete formation of interconnects, including a source interconnect 866 and a gate interconnect (not illustrated). The source interconnect 866 makes ohmic contact with the source regions 646 and the body contact regions 824, and the gate interconnect makes ohmic contact to the gate electrodes 564. The shield electrode 462 may be electrically connected to the source interconnect 866 or another interconnect that is at a fixed potential, such as ground potential.

After an optional backgrind operation, backside metal 880 is formed along the backside of the workpiece 100. The backside metal 880 may include any of the materials previously described with respect to the conductive layer for the interconnects. The backside metal 880 may also include Ni, Au, Ag, or another material that well suited for plating. In a further embodiment, the backside metal 880 may be attached to the backside of the workpiece.

In a finished device, the source interconnect 866 can be coupled to a source terminal, the gate interconnect can be coupled to a gate terminal, and the backside metal 880 can be electrically connected to a drain terminal. In an embodiment, the couplings may in the form of electrical connections.

In other embodiments, the doped regions 700 may be formed at other points in the process. In a particular embodiment, the doped regions 700 can be formed between forming the lower semiconductor layer 124 and the upper semiconductor layer 126. In such an embodiment, the doped regions 700 can initially be epitaxially grown as a monocrystalline semiconductor layer from the lower semiconductor layer 124, and the upper semiconductor layer 126 can be epitaxially grown from the monocrystalline semiconductor layer corresponding to the doped regions 700. The trenches 220 extend through the monocrystalline semiconductor layer to provide the shape of the doped regions 700 as illustrated in FIG. 7. The dopant for the doped regions 700 may include As or Sb to reduce diffusion during subsequent thermal cycles. The dopant may include P; however, the effect of the subsequent thermal cycles may need to be considered more carefully as compared to doping with As or Sb.

Figure 9:
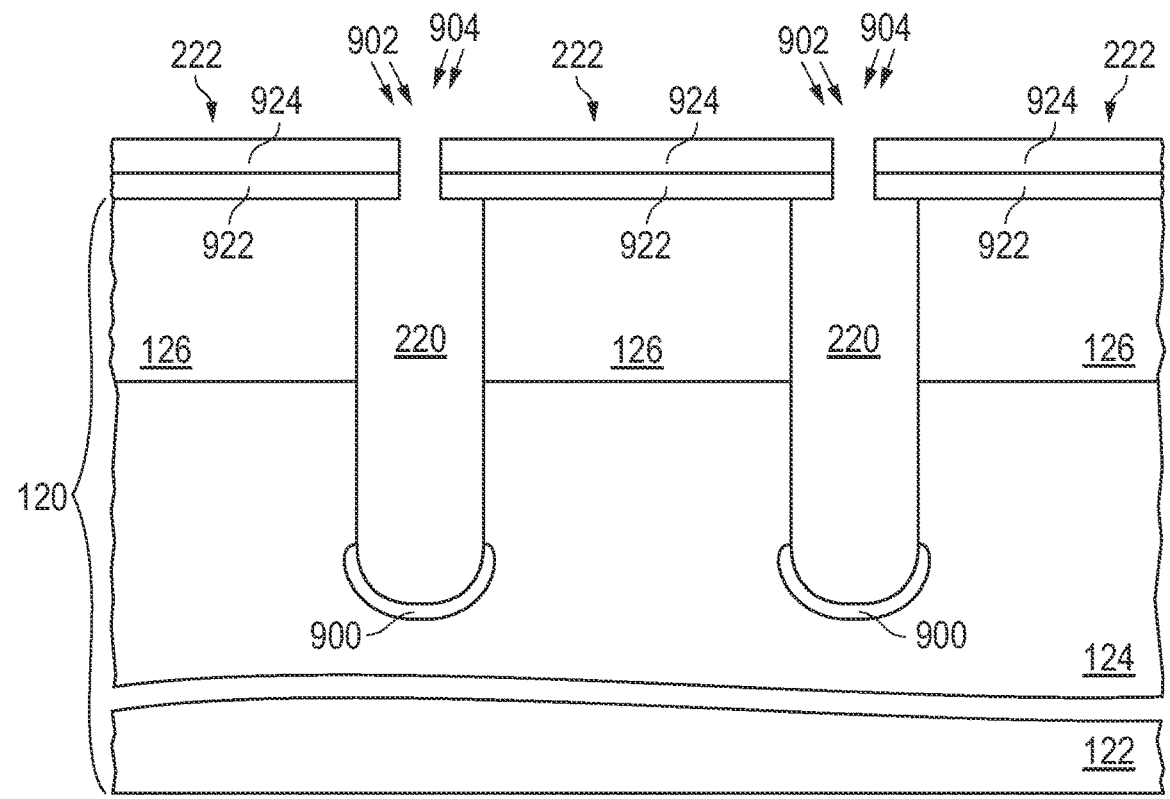
FIG. 9 includes an illustration of a cross-sectional view of a portion of a workpiece including a substrate, a patterned pad layer, and a pattered oxidation-resistant layer where arrows illustrate tilt angle implants in forming doped regions in the substrate along lower portions of trenches.

In another embodiment, dopant for the doped regions 900 can be introduced into the mesas 222 after defining the trenches 220 and before forming the insulating layer 244 (see FIG. 2 for reference). As illustrated in FIG. 9, a pad layer 922 and an oxidation-resistant layer 924 can be formed and patterned to form an opening to expose the upper semiconductor layer 126. A first trench etch can be used to form the initial shape of the trenches 220 that extend through the upper semiconductor layer 126 and into the lower semiconductor layer 124. The first trench etch can be performed using an anisotropic etching technique. A second trench etch can be performed using an isotropic etching technique to undercut portions of the pad layer 922 and oxidation-resistant layer 924. The trenches 220 can be widened and made slightly deeper during the second trench etch. Dopant can be introduced using a tilt angle ion implant to form initial doped regions along the lower portions of the sidewalls of the trenches 220. The bottom of the trenches 220 may or may not be implanted. The workpiece 100 can be rotated to ensure all sidewalls of the trenches 220 are implanted. Arrows 902 illustrate the implant during a portion of the doping, and arrows 904 illustrate the implant during another portion of the doping after the workpiece 100 is rotated. Portions of the pad layer 922 and the oxidation-resistant layer 924 help to keep dopant from being introduced into the mesas 222 at elevations higher than desired. While any n-type dopant may be used, As or Sb may be used to keep diffusion relatively low, as the implant is performed relatively early in the process flow. The doped regions 900 may have any of the dopant concentrations as previously described with respect to the doped regions 900. In a finished device, the doped regions 900 may diffuse and merge within the mesas 222 or may remain spaced apart.

The elevation of the doped regions 900 can be changed by changing the widths of the openings extending through the pad layer 922 and the oxidation-resistant layer 924 and the tilt angle of the implant. Wider openings and a higher tilt angle can allow the elevations of the doped regions 900 to be higher within the trenches 220. In a particular embodiment, the doped regions 900 may be spaced apart from the lowermost locations of the trenches 220.

Figure 10:
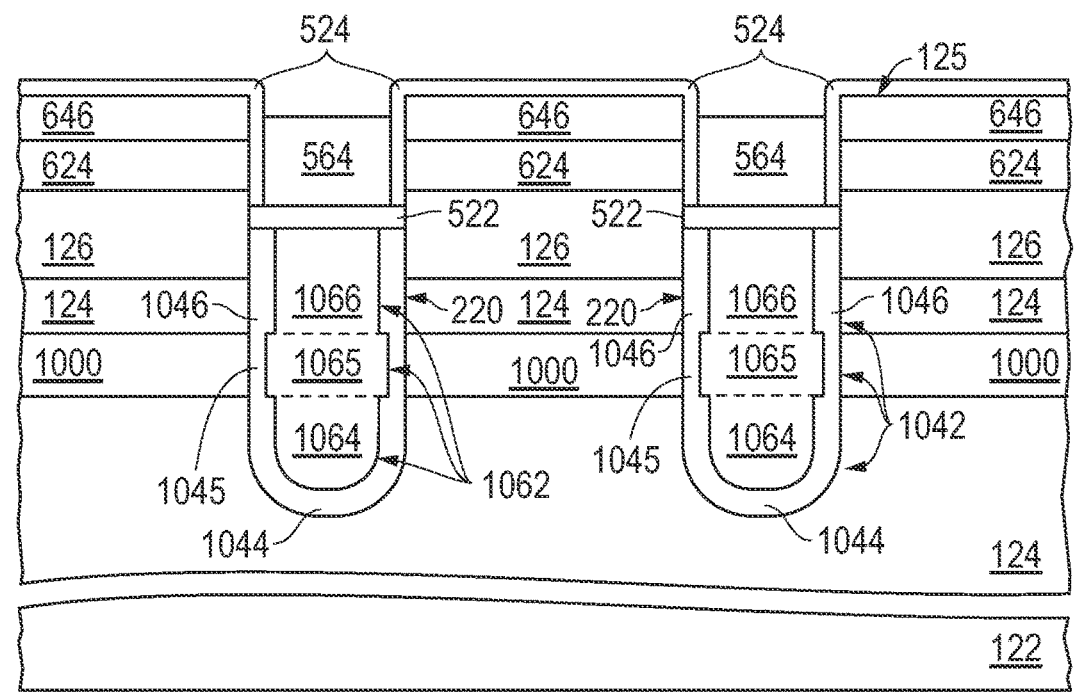
FIG. 10 includes an illustration of a cross-sectional view of a portion of a workpiece similar to the workpiece in FIG. 7 where intermediate sections of an insulating layer are thinner than adjacent sections of the insulating layer that lies along opposite sides of the intermediate sections.

In another embodiment, thinner sections of the insulating layer lining the trenches 220, corresponding doped regions, or both the thinner sections of the insulating layer and the corresponding doped regions may be at different elevations as compared to what is illustrated in prior embodiments. Referring to FIG. 10, the insulating layer 1042 can include lower sections 1044, intermediate sections 1045, and upper sections 1046, and the shield electrodes 1062 can include lower portions 1064, intermediate portions 1065, and upper portions 1066. In the embodiment as illustrated in FIG. 10, the intermediate sections 1045 of the insulating layer 1042 and the doped regions 1000 may have elevational midpoints that are closer to the elevational midpoints of shield electrodes 1062. The insulating layer 1042, the doped regions 1000, and the shield electrodes 1062 can include any of the materials previously described with respect to the insulating layer 442, the doped regions 700, and the shield electrodes 462, respectively.

The insulating layer 1042 can be initially formed along the sidewalls of the trenches 220 to the thickness of lower sections 1044 of the insulating layer 1042. The lower portions 1064 of the shield electrodes 1062 can be formed within the trenches 220. At least part of the insulating layer 1042 is removed, and an optional thermal growth or deposition can be performed to form the intermediate sections 1045 of the insulating layer 1042 along sidewalls of the trenches 220. The intermediate portions 1065 of the shield electrodes 1062 are formed within the trenches 220 adjacent to the intermediate sections 1045 of the insulating layer 1042. After forming the intermediate portions 1065 of the shield electrodes 1062, the upper sections 1046 of the insulating layer 1042 and upper portions 1066 of the shield electrodes 1062 can be formed. The intermediate sections 1045 of the insulating layer 1042 are disposed between corresponding intermediate portions 1065 of the shield electrodes 1062 and corresponding doped regions 1000. The thicknesses of the intermediate sections 1045 of the insulating layer 1042 are less than the thicknesses of the lower and upper sections 1044 and 1046 of the insulating layer 1042. The sections 1044 and 1046 may have substantially the same thickness as compared to each other or may have significantly different thicknesses. Other than elevations and heights, design considerations and parameters, including thicknesses and dopant concentrations, for the intermediate sections 1045 of the insulating layer 1042, the intermediate portions 1065 of the shield electrodes 1062, and the doped regions 1000 can be the same as the lower sections 444 of the insulating layer 442, the lower portions 364 of the shield electrodes 462, and the doped regions 700 as previously described.

The midpoint elevations of the intermediate portions 1065 and intermediate sections 1045 can be substantially the same as the midpoint elevation of their corresponding shield electrode 1062 within the same trench 220. In another embodiment, the midpoint elevations of the intermediate portions 1065 and intermediate sections 1045 can be up to 30% higher or up to 30% lower than midpoint elevation of the corresponding shield electrode 1062, where the percentages are elevation difference between (1) the midpoint elevation of the shield electrode and (2) the midpoint elevation of the intermediate portion 1065 or intermediate section 1045, divided by the height of the corresponding shield electrode 1062, times 100%. In another embodiment, the midpoint elevations of the intermediate portions 1065 and intermediate sections 1045 can be up to 20% higher or up to 20% lower than midpoint elevation of the corresponding shield electrode 1062.

The heights of the intermediate sections 1045 of the insulating layer 1042 and the intermediate portions 1065 of the shield electrodes 1062 are described as a percentage of the total height of corresponding shield electrode 1062 within the same trenches 220. In an embodiment, the heights of the intermediate sections 1045 or the intermediate portions 1065 are at least 2%, at least 5%, or at least 11% of the heights of their corresponding shield electrodes 1062, and in another embodiment, the heights of the intermediate sections 1045 or the intermediate portions 1065 are at most 70%, at most 60%, or at least 50% of the heights of their corresponding shield electrodes 1062. In a particular embodiment, the heights of the intermediate sections 1045 or the intermediate portions 1065 are in a range from 20% to 40% of the heights of their corresponding shield electrodes 1062. The heights of the portions 1064 and 1066 make up the balance of the heights of the shield electrodes 1062. The heights of the portions 1064 and 1066 may be substantially the same or significantly different. The heights of the sections 1044 and 1046 of the insulating layer 1042 can substantially the same as their corresponding portions 1064 and 1066 of the shield electrodes 1062.

Figure 11:
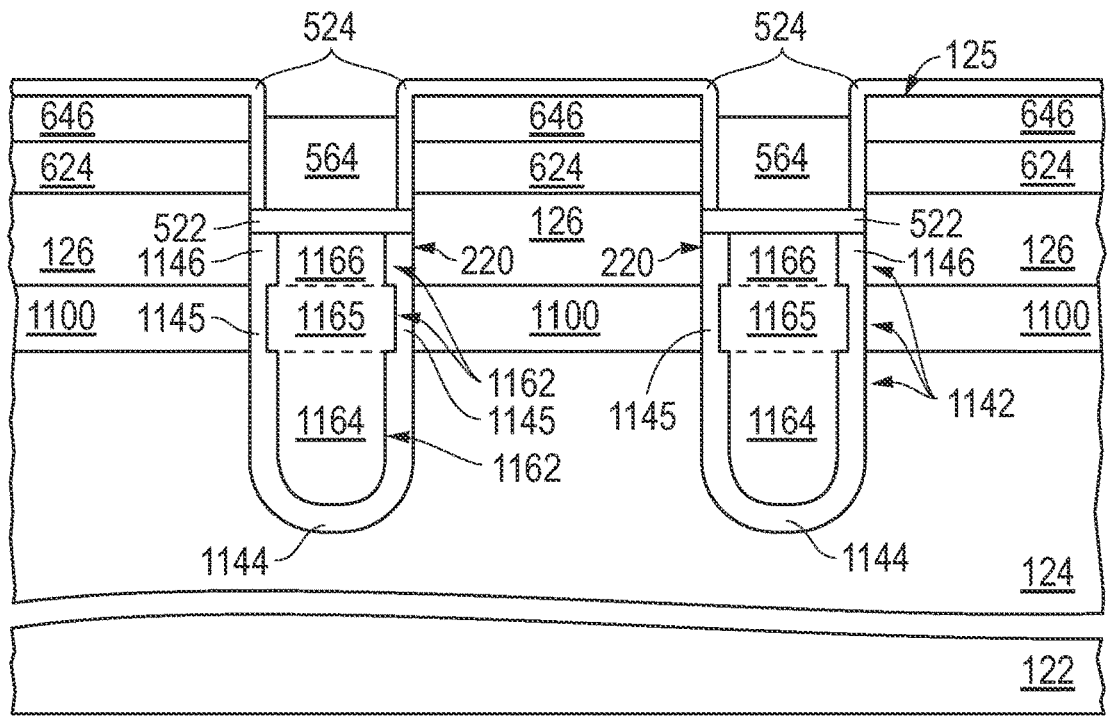
FIG. 11 includes an illustration of a cross-sectional view of a portion of a workpiece similar to the workpiece in FIG. 10 where intermediate sections of an insulating layer and intermediate portions of shield electrodes are at higher elevations in FIG. 11 as compared to FIG. 10.

FIG. 11 is similar to FIG. 10 and illustrates another embodiment where thinner sections of an insulating layer, wider portions of shield electrodes, and doped regions are at still higher elevations within the trenches 220. In the embodiment as illustrated in FIG. 11, intermediate sections 1145 of an insulating layer 1142 and doped regions 1100 have elevational midpoints that are closer to the primary surface 125 as compared to corresponding features in the embodiments illustrated in FIGS. 7 and 10. The insulating layer 1142, the doped regions 1100, and the shield electrodes 1162 can include any of the materials previously described with respect to the insulating layer 1042, the doped regions 1000, and the shield electrodes 1062, respectively.

The insulating layer 1142 can include lower sections 1144, intermediate sections 1145, and upper sections 1146. The sections 1144, 1145, and 1146 of the insulating layer 1142 can have any of the thicknesses as previously described with respect to the sections 1044, 1045, and 1046 of the insulating layer 1042 in FIG. 10. The shield electrodes 1162 can include lower portions 1164, intermediate portions 1165, and upper portions 1166. Other than elevations, design considerations and parameters, including thicknesses, heights, and dopant concentrations, for the intermediate sections 1145 of the insulating layer 1142, the intermediate portions 1165 of the shield electrodes 1162, and the doped regions 1100 can be the same as the intermediate sections 1045 of the insulating layer 1042, the intermediate portions 1065 of the shield electrodes 1062, and the doped regions 1000, respectively, as previously described.

In an embodiment, the intermediate sections 1145 of the insulating layer 1142 are offset from the tops of the shield electrodes 1162 by the intermediate portions 1165 of the shield electrodes 1162. In a particular embodiment, the heights of the upper portions 1166 of the shield electrode 1162 can be at least 20% of the height of its corresponding shield electrode 1162. Thus, the uppermost elevations of the intermediate sections 1145 of the insulating layer 1142 will be substantially the same as the lowermost elevations of the upper portions 1166 of the shield electrodes 1162. The relationship between the heights of the doped regions 1100 with respect to the intermediate sections 1145 of the insulating layer 1142 and the intermediate portions 1165 of the shield electrodes 1162 are substantially the same as previously described with respect to doped regions, thinner sections of an insulating layer, wider portions of shield electrodes previously described with respect to FIG. 10. As compared to doped regions that extend to the elevations at the uppermost points of the shield electrodes, the doped regions 1100 are farther from the body regions 624, and thus, the electrical fields between the doped regions 1100 and the body regions 624 may be lower.

Figure 12:
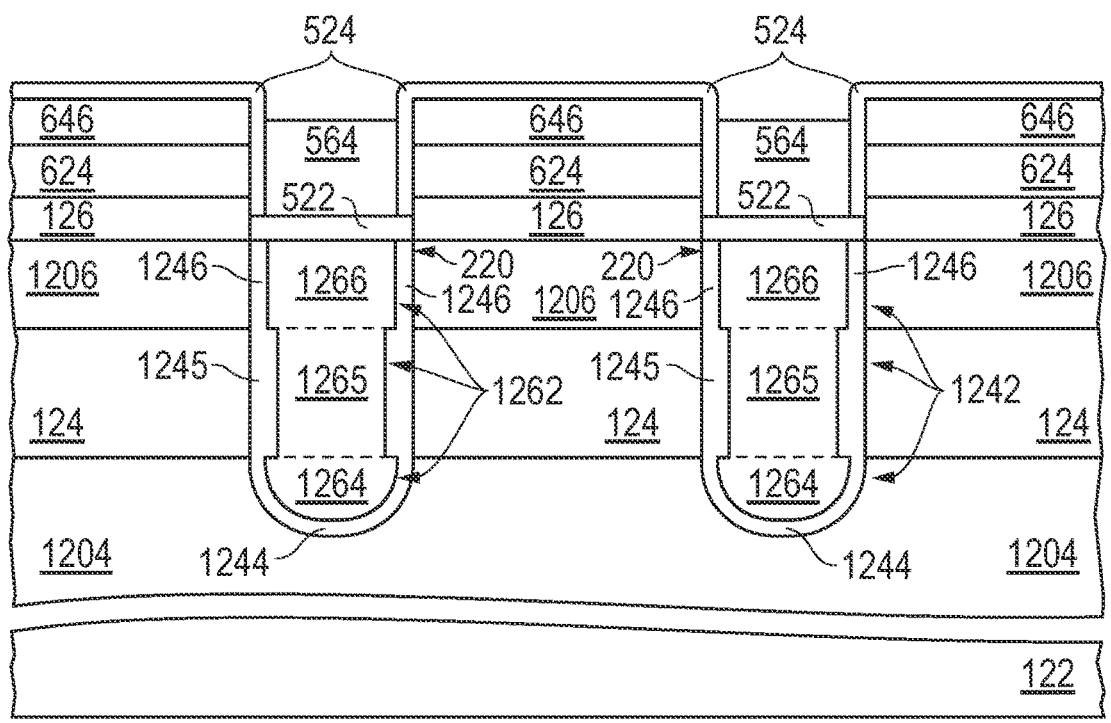
FIG. 12 includes an illustration of a cross-sectional view of a portion of a workpiece similar to the workpiece in FIG. 7 where intermediate sections of an insulating layer are thicker than adjacent sections of the insulating layer that lies along opposite sides of the intermediate sections.

In a further embodiment, more than one thinner section of the insulating layer, more than one doped region, or a combination of thinner sections and doped regions can be used. FIG. 12 includes an illustration where the insulating layer 1242 includes sections 1244, 1245, and 1246. The sections 1244 and 1246 of the insulating layer are spaced apart from each other and are thinner as compared to the intermediate sections 1245 of the insulating layer 1242. The shield electrodes 1262 include portions 1264, 1265, and 1266. The portions 1264 and 1266 are spaced apart from each other by the intermediate portions 1265. The lower sections 1244 of the insulating layer 1242 are disposed between corresponding lower portions 1264 of the shield electrodes 1262 and a doped region 1204, and the upper sections 1246 of the insulating layer 1242 are disposed between corresponding upper portions 1266 of the shield electrodes 1262 and doped regions 1206. In an embodiment, the uppermost elevation of the upper sections 1246 of the insulating layer 1242 may extend to the uppermost elevations of the upper portions 1266 of the shield electrodes 1262. In another embodiment, the uppermost elevation of the upper sections 1246 of the insulating layer 1242 may be at least 1% or at least 5% lower than the uppermost elevations of the upper portions 1266 of the shield electrodes 1262.

In an embodiment, each of the intermediate sections 1245 of the insulating layer 1242 and the intermediate portions 1265 of the shield electrode 1262 can be at least 2%, at least 11%, or at least 20% of the height of its corresponding shield electrode 1262. In another embodiment, each of the intermediate sections 1245 of the insulating layer 1242 and the intermediate portions 1265 of the shield electrode 1262 can be at most 90%, at most 80%, or at most 70% of the height of its corresponding shield electrode 1262.

In the embodiment as illustrated in FIG. 12, the doped region 1204 underlies the trenches 220 and extends into lower portions of the mesas 222. The doped region 1204 can be formed by diffusing dopant from the semiconductor base material 122 into the lower semiconductor layer 124. In another embodiment, the doped region 1204 can be a monocrystalline semiconductor layer grown from the substrate or an intervening layer, and the lower semiconductor layer 124 is grown from the monocrystalline semiconductor layer corresponding to the doped region 1204. In still another embodiment, the doped region 1204 can be formed by doping a portion of the lower semiconductor layer 124 after part or all of the lower semiconductor layer 124 is formed.

Design considerations and parameters, including thicknesses, heights, and dopant concentrations, for the insulating layer 1242, the shield electrodes 1262, and the doped regions 1204 and 1206 can be the same as or similar to corresponding structures as described with respect to other embodiments within this specification.

Figure 13:
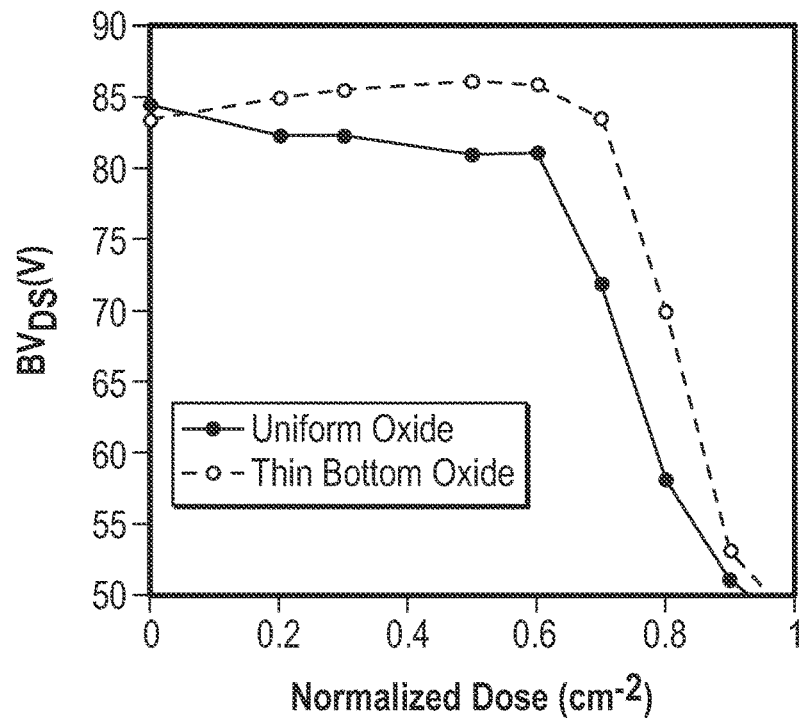
FIG. 13 includes plots of breakdown voltage as a function of normalized dose where an insulating layer has a uniform thickness and where an insulating layer has a thinner lower section.

Embodiments including thinner sections of an insulating layer along sidewalls of trenches, doped regions within mesas, or combinations of thinner sections of the insulating layer and the doped regions as described herein can help to increase $C_{OSS}$ and still maintain a sufficiently high $BV_{DS}$. FIG. 13 includes plots of $BV_{DS}$ as a function of the dose used for the doped regions 700. One of the plots corresponds to a uniform thickness for the insulating layer that lines the trenches 220, and the other plot has the insulating layer 442 where the lower section 444 has a thickness that is 10% thinner than the thickness of the upper section 446 of the insulating layer 442. When the normalized plot of implant dose for the doped regions 700 is more than 0.05, the device with the lower sections 444 has a higher $BV_{DS}$ than a comparable device with the uniform insulating layer along the sidewalls of the trenches 220. A device with a dose as high as 0.72 can still have a $BV_{DS}$ of at least 80 V. Doses in a range of 0.20 to 0.63 have breakdown voltages of at least 85 V. The insulating layer with the uniform thickness does not achieve a $BV_{DS}$ of 85 V; however, such a device may still have a $BV_{DS}$ of at least 80 V.

Figure 14:
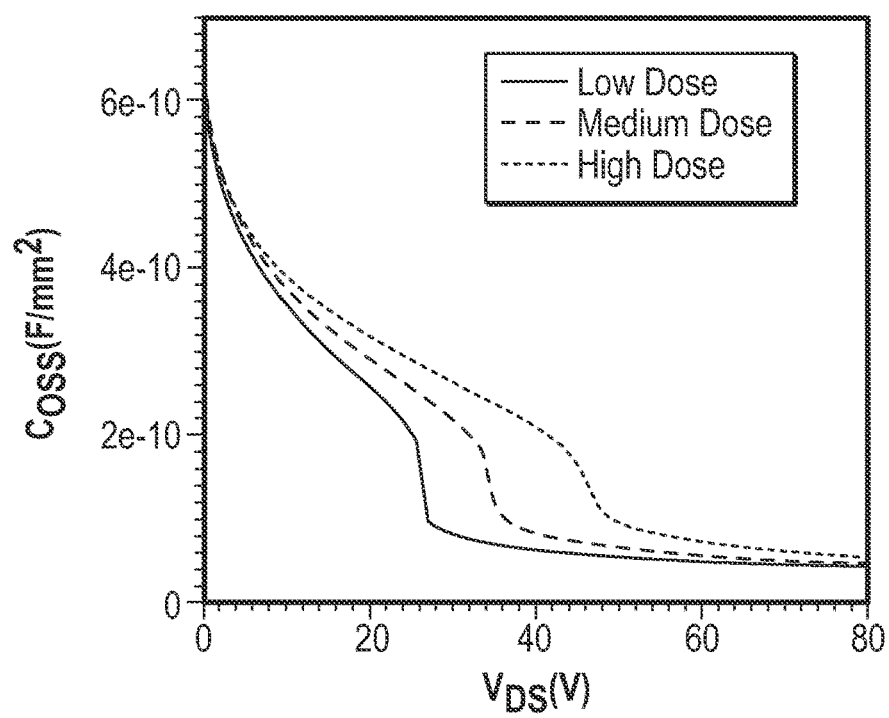
FIG. 14 includes plots of output capacitance as a function of drain-to-source voltage for different implant doses.

FIG. 14 includes plot of $C_{OSS}$ as a function of $V_{DS}$ for different normalized doses (based on the normalization used in FIG. 13) for a device designed with a voltage rating of 80 V and having the insulating layer 442 with the lower section 444 thinner than the upper section 446. When $V_{DS}$ is in a range of 20 V to 60 V, the differences in $C_{OSS}$ with different doses become more apparent, and particularly when $V_{DS}$ is in a range from 30 V to 50V. Thus, each of a thinner section of the insulating layer and a doped region within the mesa can increase $C_{OSS}$.

The other embodiments can have the same or similar benefits as compared to the embodiments having the thinner, lower sections 444 of the insulating layer 442 and the doped regions 700. After reading this specification, when the doped regions have too high of a dopant concentration, when the heights of the doped regions and the thinner sections of the insulating layer are too large, or a combination thereof, $BV_{DS}$ of the transistor can become too low. Thus, device designers may elect to run device simulations that provide desired dopant concentrations and dopants to achieve acceptable $C_{OSS}$ and $BV_{DS}$ to achieve the needs or desires for a particular application.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. An electronic device can include a substrate, an active region of a transistor, a shield electrode, and an insulating layer. The substrate can define a trench extending from a primary surface of the substrate, wherein the substrate includes a mesa adjacent to the trench, and the trench has a lowermost point along a bottom of the trench. The active region can be within the mesa. The shield electrode can be within the trench, wherein the shield electrode has an uppermost point closer to the primary surface of the substrate than to the lowermost point along the bottom of the trench. The insulating layer can include a first section and a second section, wherein each of the first section and the second section is disposed between the shield electrode and the mesa, the first section of the insulating layer has a first thickness, the second section of the insulating layer has a second thickness, the bottom of the trench is closer to the first section than to the second section, and the first thickness is thinner than the second thickness.

Embodiment 2. The electronic device of Embodiment 1 further includes a doped region within the mesa, wherein the doped region is closer to the first section of the insulating layer than to the second section of the insulating layer.

Embodiment 3. The electronic device of Embodiment 2 further includes a body region within the active region of the transistor, wherein the doped region has a dopant concentration higher than a dopant concentration of a portion of the mesa located between the body region and the doped region.

Embodiment 4. The electronic device of Embodiment 3, wherein the doped region has a dopant concentration that is at least 1.1 times a dopant concentration of the portion of the mesa located between the body region and the doped region.

Embodiment 5. The electronic device of Embodiment 3, wherein the doped region has a dopant concentration that is at most 50 times the dopant concentration of the portion of the mesa located between the body region and the doped region.

Embodiment 6. The electronic device of Embodiment 3, wherein the doped region has a dopant concentration that is higher than a dopant concentration of a portion of the substrate underlying the doped region.

Embodiment 7. The electronic device of Embodiment 2, wherein the first thickness of the first section of the insulating layer is at most 0.995 times the second thickness of the second section of the insulating layer.

Embodiment 8. The electronic device of Embodiment 2, wherein the first thickness of the first section of the insulating layer is at least 0.50 times the second thickness of the second section of the insulating layer.

Embodiment 9. The electronic device of Embodiment 2, wherein each of the first section of the insulating layer and the shield electrode has a height as measured in a depth direction, and the height of the first section is at least 5% of the height of the shield electrode.

Embodiment 10. The electronic device of Embodiment 2, wherein each of the second section of the insulating layer and the shield electrode has a height as measured in a depth direction, and the height of second section is at most 80% of the height of the shield electrode.

Embodiment 11. The electronic device of Embodiment 2, wherein the insulating layer includes a transition region between the first section of the insulating layer and the second section of the insulating layer, wherein the transition region has a height that is at most 80% of the height of the shield electrode.

Embodiment 12. An electronic device can include a substrate, a shield electrode, a body region, and a doped region. The substrate can define a trench extending from a primary surface of the substrate, wherein the substrate includes a mesa adjacent to the trench. The shield electrode can be within the trench; and a body region can be within the mesa. The doped region can be within the mesa, spaced apart from the body region by a semiconductor region, and adjacent to the shield electrode. The body region and the doped region can be parts of an active region of a transistor. The doped region can have a dopant concentration that is higher than a dopant concentration of each of the semiconductor region and a portion of the substrate underlying the doped region.

Embodiment 13. The electronic device of Embodiment 12, wherein the dopant concentration of the doped region is at least 2 times higher than the dopant concentration of each of the semiconductor region and the portion of the substrate.

Embodiment 14. The electronic device of Embodiment 12, wherein a dopant concentration of the doped region is at most 50 times higher than the dopant concentration of each of the semiconductor region and the portion of the substrate.

Embodiment 15. The electronic device of Embodiment 14, wherein the doped region is spaced apart from a lowermost point of the trench.

Embodiment 16. An electronic device can include a substrate, a shield electrode, and an insulating layer. The substrate can define a trench extending from a primary surface of the substrate, wherein the substrate includes a mesa adjacent to the trench. The shield electrode can be within the trench, and the insulating layer can be disposed between the mesa and the shield electrode. The insulating layer can be disposed between the mesa and the shield electrode. The insulating layer can include a first section adjacent to a first portion of the shield electrode, a second section adjacent to a second portion of the shield electrode, and a third section adjacent to a third portion of the shield electrode. The second section can be disposed between the first section and the third section, and the second portion can be disposed between the first portion and the third portion. Each of the first section of the insulating layer and the third section of the insulating layer is thinner than the second section of the insulating layer.

Embodiment 17. The electronic device of Embodiment 16 further includes a body region, a first doped region, and a second doped region, each within the mesa. The first doped region can be spaced apart from the body region and adjacent to the first portion of shield electrode; and the second doped region can be spaced apart from the first doped region and adjacent to the third portion of the shield electrode. Each of the first doped region and the second doped region can have a dopant concentration that is greater than dopant concentrations of portions of the mesa (1) between the body region and the first doped region and (2) between the first and second doped regions.

Embodiment 18. The electronic device of Embodiment 16, wherein each of the first doped region and the second doped region has a dopant concentration greater than a portion of the substrate below both of the first doped region and the second doped region.

Embodiment 19. The electronic device of claim Embodiment 16, wherein the second doped region extends to a lowermost point of the trench.

Embodiment 20. The electronic device of claim Embodiment 16, wherein the second section of the insulating layer has a height that is at least 2% of the height of the shield electrode.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a substrate defining a trench extending from a primary surface of the substrate, wherein the substrate includes a mesa adjacent to the trench;
   a shield electrode within the trench;
   a first doped region within the mesa and having a first conductivity type;
   a second doped region within the mesa and having the first conductivity type, wherein:
   the second doped region is spaced apart from the first doped region by a portion of the mesa;
   the portion of the mesa has the first conductivity type, and each of the first doped region and the second doped region has a dopant concentration that is greater than a dopant concentration of the portion of the mesa; and a first insulating layer including a first section, a second section, and a third section, wherein:
the second section is disposed between the first section and the third section, and
a thickness of the second section of the first insulating layer is greater than each of a thickness of the first section of the first insulating layer and a thickness of the third section of the first insulating layer,
wherein:
the first section of the first insulating layer is disposed between the shield electrode and the first doped region, and the first section contacts the first doped region,
the second section of the first insulating layer is disposed between the shield electrode and the portion of the mesa, and the second section contacts the portion of the mesa, and
the third section of the first insulating layer is disposed between the shield electrode and the second doped region, and the third section contacts the second doped region.

2. The electronic device of claim 1, further comprising:
a body region within the mesa and having a second conductivity type opposite the first conductivity type, wherein the body region overlies each of the first doped region, the second doped region, and the portion of the mesa.

3. The electronic device of claim 2, further comprising a source region within the mesa, wherein:
the source region has the first conductivity type, overlies and contacts the body region.

4. The electronic device of claim 3, further comprising:
a gate electrode overlying the shield electrode;
a gate dielectric layer disposed between the mesa and the gate electrode; and
a second insulating layer, wherein the path electrode is spaced apart from the shield electrode by at least the second insulating layer.

5. The electronic device of claim 1, wherein each of the first doped region and the second doped region has a dopant concentration greater than a dopant concentration of a portion of the substrate below both of the first doped region and the second doped region.

6. The electronic device of claim 1, wherein the second doped region extends to a lowermost point of the trench.

7. The electronic device of claim 1, wherein the second section of the first insulating layer has a height that is at least 2% of the height of the shield electrode.

8. The electronic device of claim 4, wherein:
the shield electrode has a first portion, a second portion, and a third portion, wherein the second portion is disposed between the first portion and the third portion,
each of the first portion of the shield electrode, the second portion of the shield electrode, and the third portion of the shield electrode has a width measured in a direction parallel to the primary surface, and
the width of the second portion of the shield electrode is less than each of the width the first portion of the shield electrode and the width of the third portion of the shield electrode.

9. An electronic device comprising:
a substrate defining a trench extending from a primary surface of the substrate, wherein the substrate includes a mesa adjacent to the trench;
a shield electrode within the trench, wherein:
the shield electrode has a first portion, a second portion, and a third portion, wherein the second portion is disposed between the first portion and the third portion,
the primary surface is closest to the first portion as compared to the second portion and the third portion, and the primary surface is farthest from the third portion as compared to the first portion and the second portion,
each of the first portion, the second portion, and the third portion has a width measured in a direction parallel to the primary surface, and
the width of the second portion is less than each of the width of the first portion and the width of the third portion;
a first doped region within the mesa and having a first conductivity type and a first dopant concentration;
a second do d regio the mesa and having the first conductivity type and a second dopant centration,
wherein:
the first doped region is spaced apart from the second doped region by an intermediate portion of the mesa, and
the intermediate portion of the mesa has the first conductivity type and a third dopant concentration that is less than the first dopant concentration and the second dopant concentration; and
a first insulating layer disposed between the mesa and the shield electrode, wherein:
the first insulating layer includes a first section, a second section, and a third section,
the first section, the second section, and the third section are disposed between the mesa and the shield electrode, wherein:
the second section is disposed between the first section and the third section,
the first section contacts the first portion of the shield electrode and the first doped region,
the second section contacts the second portion of the shield electrode and the intermediate portion of the mesa,
the third section contacts the third portion of the shield electrode and the second doped region, and
a thickness of the second section of the first insulating layer is greater than each of a thickness of the first section of the first insulating layer and a thickness of the third section of the first insulating layer.

10. The electronic device of claim 9, further comprising a semiconductor base material, wherein the second doped region is disposed between the intermediate portion of the mesa and the semiconductor base material.

11. The electronic device of claim 9, further comprising:
a source region within the mesa, wherein the source region has the first conductivity type; and
a body region within the mesa, wherein;
the body region has a second conductivity type opposite the first conductivity type, and
the body region underlies and contacts the source region and overlies the first doped region, the second doped region, and the intermediate portion of the mesa.

12. The electronic device of claim 11, further comprising:
a gate electrode overlying the shield electrode;
a gate dielectric layer disposed between the mesa and the gate electrode; and
a second insulating layer, wherein the gate electrode is spaced apart from the shield electrode by the second insulating layer.

13. An electronic device comprising:
a substrate including a semiconductor layer and defining a trench extending from a primary surface of the substrate, wherein the substrate includes a mesa adjacent to the trench, and the trench has a lowermost point;
a shield electrode within the trench;
a first doped region disposed between a portion of the mesa above the first doped region and a portion of the semiconductor layer below the first doped region, wherein:
 a lowermost point of the first doped region is at an elevation higher than an elevation of the lowermost point of the trench,
 the first doped region, the portion of the mesa, and the portion of the semiconductor layer have a first conductivity type, and
 a dopant concentration of the first doped region is greater than each of a dopant concentration of the portion of the mesa and a dopant concentration of the portion of the semiconductor layer;
a body region having a second conductivity type opposite the first conductivity type, wherein the body region overlies the portion of the mesa, the first doped region, and the portion of the semiconductor layer; and
an insulating layer disposed between the mesa and the shield electrode, wherein:
 the insulating layer includes a first section and a second section,
 the first section contacts the first doped region,
 the second section contacts the portion of the semiconductor layer, and
 a thickness of the first section of the insulating layer is thinner than a thickness of the second section of the insulating layer.

14. The electronic device of claim 13, further comprising a gate electrode, wherein:
the shield electrode includes a first portion, a second portion, and a third portion, wherein the second portion is disposed between the first portion and the third portion,
along a cross-sectional view within the trench, the gate electrode overlies all of the first portion, second portion, and the third portion of the shield electrode, and a lowermost point of the gate electrode is at a higher elevation than elevations of the first section a nd the second section of the insulating layer,
the first section of the insulating layer contacts the second portion of the shield electrode,
the second section of the insulating layer contacts the third portion of the shield electrode,
each of the first portion of the shield electrode, the second portion of the shield electrode, and the third portion of the shield electrode has a width measured in a direction parallel to the primary surface, and
the width of the first portion of the shield electrode is greater than the width of the second portion of the shield electrode.

15. The electronic device of claim 13, further comprising:
a gate electrode disposed within the trench; and
a gate dielectric layer disposed between the gate electrode and the mesa.

16. The electronic device of claim 13, wherein:
the portion of the semiconductor layer includes a second doped region and an intermediate portion disposed between the first doped region and the second doped region,
the second doped region has the first conductivity type and a dopant concentration higher than a dopant concentration of the intermediate portion of the semiconductor layer,
the second section of the insulating layer contacts the intermediate portion of the semiconductor layer, and
the insulating layer further includes a third section that contacts the second doped region and has a thickness thinner than the thickness of the second section of the insulating layer.

17. The electronic device of claim 13, wherein a dopant concentration of the first doped region is in a range from 2 times to 50 times an average dopant concentration of the portion of the mesa.

18. The electronic device of claim 9, wherein a dopant concentration of the first doped region or the second doped region is in a range from 2 times to 50 times an average dopant concentration of a portion of the mesa disposed between the first doped region and the second doped region.

19. The electronic device of claim 15, further comprising:
a source region overlying the body region and having the first conductivity type;
a source interconnect that makes an ohmic contact with the source region; and
a gate interconnect that makes an ohmic contact with the gate electrode,
wherein the shield electrode is electrically connected the source interconnect or another interconnect that is adapted to be at a fixed potential.

20. The electronic device of claim 16, wherein:
the shield electrode has a first portion, a second portion, and a third portion, wherein the second portion is disposed between the first portion and the third portion,
the first section of the insulating layer contacts the first portion of the shield electrode,
the second section of the insulating layer contacts the second portion of the shield electrode,
the third section of the insulating layer contacts the third portion of the shield electrode,
each of the first portion, the second portion, and the third portion has a width measured in a direction parallel to the primary surface,
the width of the second portion is less than each of the width of the first portion and the width of the third portion.

* * * * *

UNITED STATES PATENT AND TRADEMARK OFFICE
CERTIFICATE OF CORRECTION

PATENT NO. : 12,166,090 B2
APPLICATION NO. : 17/660691
DATED : December 10, 2024
INVENTOR(S) : Zia Hossain et al.

Page 1 of 1

It is certified that error appears in the above-identified patent and that said Letters Patent is hereby corrected as shown below:

In the Claims

In Claim 4, Column 19, Line 42, delete "path electrode" and add -- gate electrode --;
In Claim 9, Column 20, Lines 24 and 25, delete "a second do d regio the mesa and having the first conductivity type and a second dopant centration" and add -- a second doped region within the mesa and having the first conductivity type and a second dopant concentration --;
In Claim 11, Column 20, Line 61, delete "wherein;" and add -- wherein: --;
In Claim 14, Column 21, Line 53, delete "section a nd" and add -- section and --; and
In Claim 16, Column 22, Line 19, delete "semiconductor laver" and add -- semiconductor layer --.

Signed and Sealed this
Fourth Day of March, 2025

Coke Morgan Stewart
*Acting Director of the United States Patent and Trademark Office*